United States Patent
Chen

(10) Patent No.: US 9,502,400 B2
(45) Date of Patent: *Nov. 22, 2016

(54) DECOUPLING CAPACITOR AND METHOD OF MAKING SAME

(71) Applicant: Taiwan Semiconductor Manufacturing Co., Ltd., Hsin-Chu (TW)

(72) Inventor: Chung-Hui Chen, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 88 days.

This patent is subject to a terminal disclaimer.

(21) Appl. No.: 14/808,040

(22) Filed: Jul. 24, 2015

(65) Prior Publication Data

US 2015/0333054 A1  Nov. 19, 2015

Related U.S. Application Data

(60) Continuation of application No. 14/178,383, filed on Feb. 12, 2014, now Pat. No. 9,123,556, which is a division of application No. 13/344,137, filed on Jan. 5, 2012, now Pat. No. 8,692,306.

(51) Int. Cl.

| | |
|---|---|
| H01L 27/06 | (2006.01) |
| H01L 29/06 | (2006.01) |
| H01L 49/02 | (2006.01) |
| H01L 23/522 | (2006.01) |
| H01L 29/73 | (2006.01) |
| H01L 27/02 | (2006.01) |
| H01L 23/528 | (2006.01) |
| H01L 21/762 | (2006.01) |
| H01L 29/66 | (2006.01) |

(52) U.S. Cl.
CPC ........ *H01L 27/067* (2013.01); *H01L 21/76224* (2013.01); *H01L 23/5223* (2013.01); *H01L 23/5286* (2013.01); *H01L 27/0207* (2013.01); *H01L 27/0629* (2013.01); *H01L 27/0635* (2013.01); *H01L 28/40* (2013.01); *H01L 28/88* (2013.01); *H01L 29/0649* (2013.01); *H01L 29/66477* (2013.01); *H01L 29/73* (2013.01); *H01L 2924/0002* (2013.01)

(58) Field of Classification Search
USPC .................................. 257/296, 526
See application file for complete search history.

(56) References Cited

U.S. PATENT DOCUMENTS

| | | | |
|---|---|---|---|
| 7,262,951 B2 | 8/2007 | Hou et al. | |
| 8,692,306 B2 * | 4/2014 | Chen ................... | H01L 27/0629 257/296 |
| 9,123,556 B2 * | 9/2015 | Chen ................... | H01L 27/0629 |
| 2006/0163665 A1 * | 7/2006 | Chuang ........... | H01L 21/823437 257/374 |
| 2007/0069295 A1 | 3/2007 | Kerr et al. | |
| 2010/0078695 A1 * | 4/2010 | Law .................... | H01L 23/5223 257/296 |
| 2010/0163872 A1 | 7/2010 | Lim | |
| 2010/0255647 A1 | 10/2010 | Yamakoshi et al. | |
| 2014/0159195 A1 * | 6/2014 | Chen ................... | H01L 27/0629 257/526 |
| 2015/0333054 A1 * | 11/2015 | Chen ................... | H01L 27/0629 257/296 |

* cited by examiner

*Primary Examiner* — Zandra Smith
*Assistant Examiner* — Lawrence Tynes, Jr.
(74) *Attorney, Agent, or Firm* — Duane Morris LLP

(57) ABSTRACT

A semiconductor substrate has at least two active regions, each having at least one active device that includes a gate electrode layer, and a shallow trench isolation (STI) region between the active regions. A decoupling capacitor comprises first and second dummy conductive patterns formed in the same gate electrode layer over the STI region. The first and second dummy conductive regions are unconnected to any of the at least one active device. The first dummy conductive pattern is connected to a source of a first potential. The second dummy conductive pattern is connected to a source of a second potential. A dielectric material is provided between the first and second dummy conductive patterns.

20 Claims, 5 Drawing Sheets

DECOUPLING CAPACITOR AND METHOD OF MAKING SAME

RELATED APPLICATIONS

This application is a continuation of U.S. patent application Ser. No. 14/178,383, filed Feb. 12, 2014, which is a division of U.S. patent application Ser. No. 13/344,137, filed Jan. 5, 2012, which issued as U.S. Pat. No. 8,692,306, and each of the foregoing applications is expressly incorporated by reference herein in its entirety.

FIELD

This disclosure relates to semiconductor integrated circuit devices and fabrication methods.

BACKGROUND

Power supply lines in a semiconductor integrated circuit (IC) supply current to charge and discharge active and passive devices in the IC. For example, digital complementary metal-oxide-semiconductor (CMOS) circuits draw current when the clock makes a transition. During the operation of circuits, the power supply lines supply transient currents with a relatively high intensity, which can result in voltage noise on the power supply lines. The voltage on the power supply line will fluctuate when the fluctuation time of the transient current is short or when its parasitic inductance or parasitic resistance is large.

The operational frequency of the IC may be on the order of several hundreds of mega-hertz (MHz) to several giga-hertz (GHz). In such circuits, the rising time of clock signals is very short, so that voltage fluctuations in the supply line may be very large. Undesired voltage fluctuations in the power supply line powering a circuit can cause noise on its internal signals and degrade noise margins. The degradation of noise margins can reduce circuit reliability or even cause circuit malfunction.

To reduce the magnitude of voltage fluctuations in the power supply lines, filtering or decoupling capacitors are usually used between the terminals of different power supply lines or between terminals of power supply line and the ground line. Decoupling capacitors act as charge reservoirs that additionally supply currents to circuits to prevent momentary drops in supply voltage.

DETAILED DESCRIPTION

Figure 1:
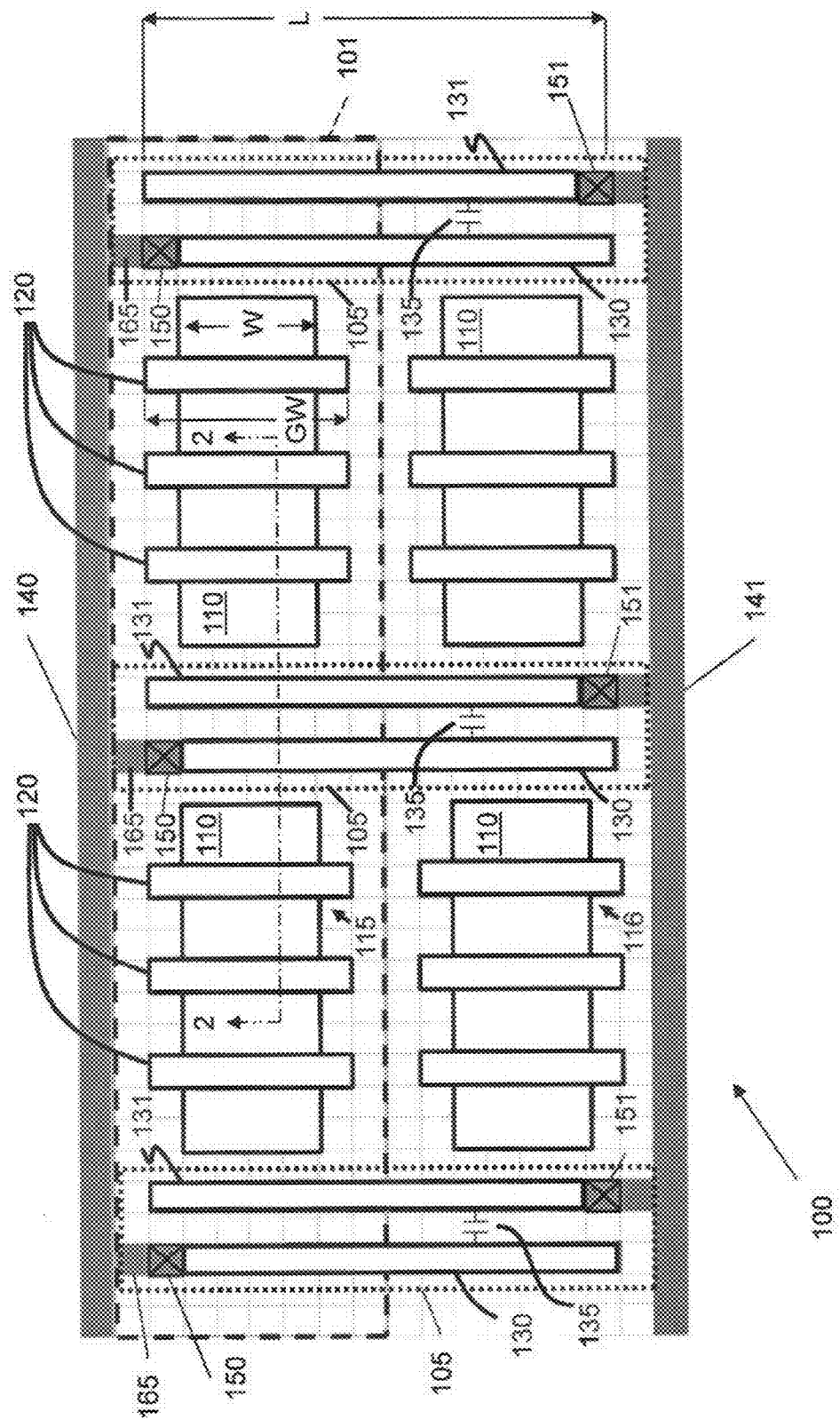
FIG. 1 is a schematic plan view of a portion of an IC having a decoupling capacitor between metal oxide semiconductor field effect transistors (MOSFETs).

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

For advanced technologies, such as those having critical dimensions (CD) of 32 nm or smaller, stricter design rules may be adopted to promote high yield. One design rule that is frequently employed is the use of a "poly-density" rule. "Poly-density" refers to the ratio of the area of gate electrode layer material to the total IC area. It has been determined that maintaining at least a minimum threshold poly-density across the IC helps prevent dishing and erosion in subsequently deposited interconnect layers.

Poly-density design rules are observed regardless of whether the gate electrode layer is formed of polycrystalline silicon or a high-k metal gate material. In the description below, unless expressly indicated to refer to semiconductor, references to "poly layer material" refers to any gate electrode layer material, regardless of whether polycrystalline silicon or metal.

In many cases, the area occupied by gate and/or capacitor electrodes in the gate electrode layer is relatively small compared to an area that meets the poly-density design rule. To meet the design rule, dummy poly layer material is inserted. The dummy poly layer material is not part of, or connected to, any of the active devices of the IC, and does not perform any logic function. Dummy poly layer patterns may be located on the shallow trench isolation (STI) region next to the active area, for example. Addition of dummy poly layer material to meet the poly density design rule can help poly gate lithography, and also help edge finger-configuration source/drain (S/D) regions avoid abnormal epitaxial material formation. Dummy poly patterns may be placed over the STI regions for either analog or digital circuits.

Embodiments described below utilize dummy poly patterns on STI to form metal-oxide-metal (MOM) decoupling capacitors between active devices. Thus, the dummy patterns serve a dual purpose. In addition to satisfying poly density design rules, the dummy patterns form fringe-type decoupling capacitors. If a design already includes dummy conductor patterns, there is no need to occupy a large chip area with additional decoupling capacitor patterns, and vice-versa.

Figure 2:
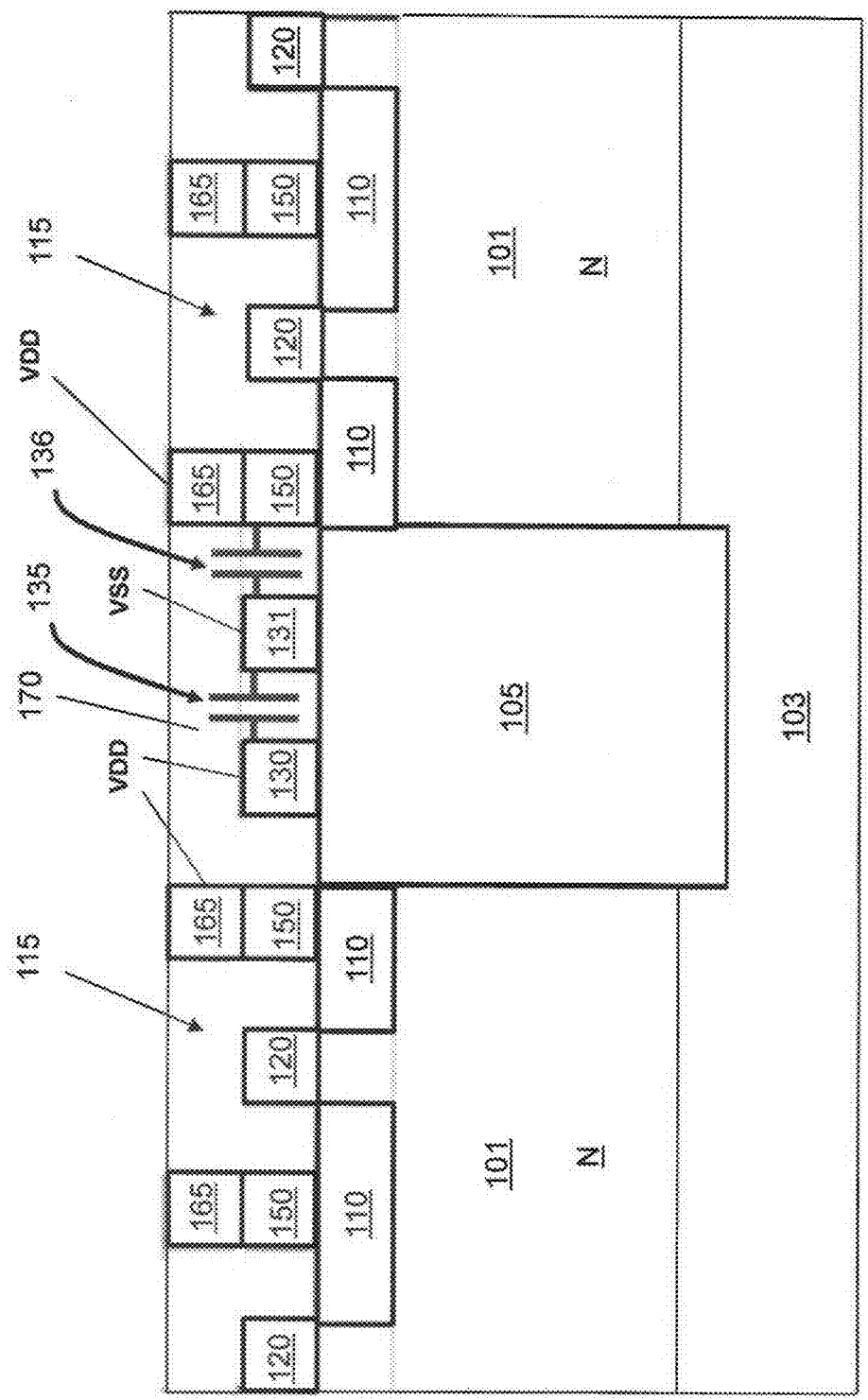
FIG. 2 is a side elevation cross sectional view of the device of FIG. 1, taken along section line 2-2 of FIG. 1.

FIGS. 1 and 2 show one example of an IC 100 having a decoupling capacitor structure 135.

The IC includes semiconductor substrate 103. The substrate 103 can be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, for example. In some embodiments, at least one transistor 115, diode, device, circuit or other semiconductor structure or various combinations thereof (not shown) are formed below the dielectric layer 170 and electrically coupled to each other. Although FIGS. 1 and 2 show transistors 115, the decoupling capacitors 135 and 136 may be configured and used similarly for diodes or other devices.

FIG. 2 shows the configuration at the conclusion of front end of line (FEOL) processing, up to the first metal layer (M1) 165. One of ordinary skill in the art understands that additional interconnect layers are subsequently formed during back end of line (BEOL) processing. These additional BEOL layers are omitted from FIGS. 1 and 2 for clarity. Also, although FIGS. 1 and 2 show interconnections in the M1 layer connecting the dummy conductor 130 to the VDD bus 140 and connecting dummy conductor 131 to the VSS bus 141, one of ordinary skill can readily form similar connections in the M2, M3 or other interconnect layer.

FIG. 2 shows a cross section of the P MOSFETs 115. The IC includes at least two active regions 110, each having at least one active device 115 that includes a gate electrode layer 120. A shallow trench isolation (STI) region 105 is provided between the active regions 110, Each PMOS 115 has an N well 101, with the N wells separated by a STI region 105. A pair of source/drain regions 110 are formed in the substrate by implanting P+ impurities (e.g., boron). Each N MOSFET 116 has a P well with source drain regions 110 formed by implanting N+ impurities (e.g., phosphorus).

A thin gate insulating layer (not shown) is formed between and above the source/drain regions 110. In some embodiments, a silicon oxide gate insulating layer is provided. In other embodiments, the insulating layer comprises a high-K dielectric, such as, but not limited to, a hafnium based oxide, a hafnium based oxynitride, or a hafnium-silicon oxynitride, hafnium silicate, zirconium silicate, hafnium dioxide and zirconium dioxide. The high-k dielectric layer may include a binary or ternary high-k film such as HfO, LaO, AlO, ZrO, TiO, Ta2O5, Y2O3, STO, BTO, BaZrO, HfZrO, HfLaO, HfTaO, HfTiO, combinations thereof, or other suitable materials. Alternatively, the high-k dielectric layer 111 may optionally include a silicate such as HfSiO, LaSiO, AlSiO, combinations thereof. The insulating layer may be deposited using atomic layer deposition.

Gate electrodes 120 are then formed between and above the source/drain regions 110, above the gate insulating layer. The gate electrode 120 may comprise polycrystalline silicon, or a metal or alloy, such as but not limited to, titanium nitride, tantalum nitride, or aluminum nitride.

At the same time the gate electrodes 120 are formed, the dummy conductor patterns 130, 131 are formed in the same gate electrode layer, over the STI regions 105. The dummy conductors 130, 131 can be conveniently patterned using the same photomask that patterns the gate electrodes 120, without adding any step or photomask to the fabrication process. In some embodiments, the dummy conductor patterns 130, 131 are elongated line segments.

Dielectric material 170 fills the space between the dummy conductors 130, 131. The dielectric material 170 may include one or more layers of same or different dielectric materials. For example, dielectric 170 may include two layers formed sequentially above the substrate 103 and gate electrodes 120. These two layers may include: a passivation layer (not shown) such as silicon nitride (SiN) or silicon carbon nitride and a dielectric layer (not shown) such as silicon oxynitride or a low-k dielectric material having a dielectric constant of about 3.5 or less, such as "SiLK™" dielectric from Dow Chemical Co. of Midland Mich., or "Black Diamond™" dielectric from Applied Materials Corp. of Santa Clara, Calif.

Each adjacent pair of dummy conductor patterns 130, 131 and the dielectric material 170 between them forms a decoupling capacitor 135, shown schematically in FIGS. 1 and 2. The decoupling capacitor 135 is provided by the fringe capacitance between the side edges of conductors 130 and 131, which face each other. Thus, the capacitance of the decoupling capacitor 135 depends on the thickness of the gate electrode layer 130, 131, the length of the overlapping portions of the dummy conductors 130, 131, the distance between the adjacent edges of conductors 130, 131 and the dielectric constant of the dielectric material 170. Each decoupling capacitor has a length L that is greater than a width W of the active region 110. In some embodiments, the first and second conductive patterns extend nearly the entire distance between the VDD bus and the VSS bus, maximizing the decoupling capacitance. Each gate electrode has a gate width GW, and the first and second dummy conductive patterns 130, 131 are each longer than the gate width GW.

Contact vias 150 are formed for interconnecting the source/drain regions 110 in the interconnect layers. Contact vias 150 are also formed at one end of each of the dummy conductors 130, 131. In some embodiments, the contact vias are arranged so that contact vias 150 for conductors 130 are at the end of the conductors closer to the VDD bus 140, and contact vias 150 for conductors 131 are at the end of the conductors closer to the VSS bus 141. For forming the contacts, contact openings are formed in the dielectric 170, and a metal such as tungsten is deposited via sputter deposition, evaporation or chemical vapor deposition (CVD).

As shown in FIG. 1, a power (VDD) bus 140 and a ground (VSS) bus 141 are provided in the M1 layer. Line segments 165 in the M1 layer connects the contact via 150 of dummy conductor 130 to the power bus 140 and connects the contact via 150 of dummy conductor 131 to the ground bus 141. Thus, the first dummy conductive pattern 130 is connected to a source of a first potential, and the second dummy conductive pattern connected to a source of a second potential.

Figure 3:
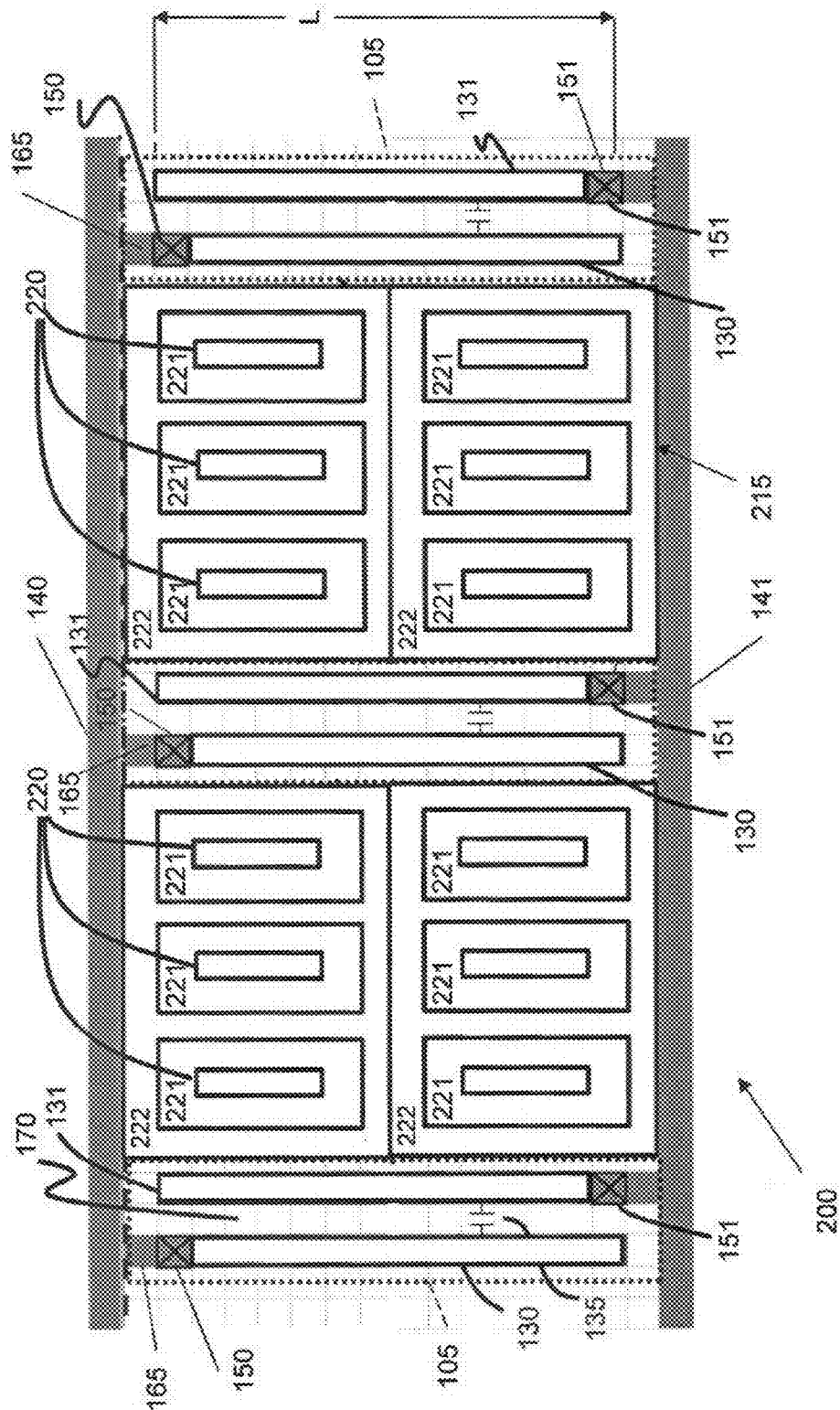
FIG. 3 is a schematic plan view of a portion of an IC having a decoupling capacitor between bipolar junction transistors (BJT).

FIG. 3 shows another example of an IC 200, in which the at least one active device is a bipolar junction transistor (BJT) 215. BJT 215 includes three differently doped semiconductor regions, the emitter 220, the base region 221 and the collector region 222. In some embodiments, the emitter 220, base 221 and collector 222 regions are p type, n type and p type, respectively forming a PNP transistor. In other embodiments, the emitter, base and collector regions are n type, p type and n type, forming an NPN transistor. The emitter region 220 may be formed in the polysilicon layer. The emitter region of the polysilicon layer 220 is implanted (or doped in-situ) with boron or another p-type dopant for a PNP transistor, or implanted with arsenic or another n-type dopant for an NPN transistor.

At the same time the emitter 220 is formed, the dummy conductor patterns 130, 131 are formed in the same polysilicon layer, over the STI regions 105. The dummy conductors 130, 131 can be conveniently patterned using the same photomask that patterns the emitter 220, without adding any step or photomask to the fabrication process. In some embodiments, the dummy conductor patterns 130, 131 are elongated line segments.

Dielectric material 170 fills the space between the dummy conductors 130, 131. The dielectric material 170 may include one or more layers of same or different dielectric materials. For example, dielectric 170 may include any of the dielectric materials described above with reference to the embodiment of FIGS. 1 and 2.

Each adjacent pair of dummy conductor patterns 130, 131 and the dielectric material 170 between them forms a decoupling capacitor 135, shown schematically in FIG. 3.

The decoupling capacitor 135 is provided by the fringe capacitance between the side edges of conductors 130 and 131, which face each other.

Although examples are described above using the dummy conductive patterns in the poly layer to form decoupling capacitors between MOSFETs in an NMOS, PMOS or CMOS process, or between BJTs in a bipolar process, the same decoupling capacitors may be used between MOSFETs and BJTs in a BiCMOS process. In a BiCMOS process, the same polysilicon layer can provide gate electrodes, dummy conductors and decoupling capacitors in the MOSFETs, and emitter regions, dummy conductors and decoupling capacitors for the BJTs.

Figure 4:
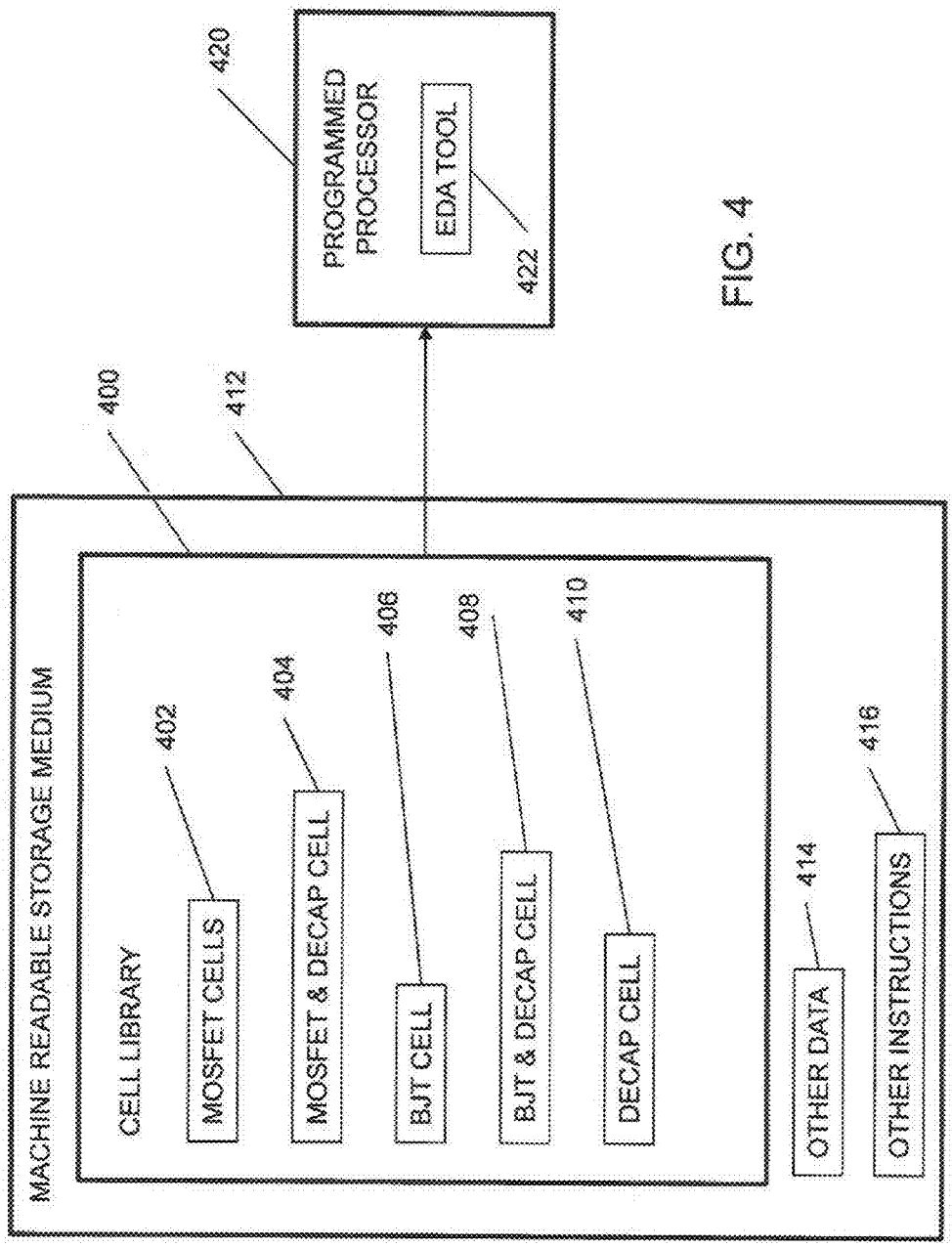
FIG. 4 is a block diagram of a computer system for providing an EDA tool that uses a cell library for forming the decoupling capacitor.

FIG. 4 shows a modification to a standard cell library to incorporate the decoupling capacitors described above. Herein, the term "standard cell" refers to the cells' attribute of being a selectable, reusable unit to be used with an electronic design automation (EDA) tool, and does not imply any limitation as to whether the cell designs are conventional or future developed cells. A programmed processor 420 is configured to operate an EDA tool 422. The processor 420 may be, for example, a general purpose computer or embedded processor configured by programming with special purpose computer program instructions 416 stored in a persistent machine readable storage medium 412. The EDA tool 422 may include, for example, tools for logic synthesis, place and route, design rule checks and layout versus schematic, among others. The medium also includes other data 414, including but not limited to design rule data.

For example, an EDA tool may use a combination of the following modules: logic synthesis, behavioral synthesis, place and route, static timing analysis, formal verification, HDL (SystemC, Systemverilog/Verilog, VHDL) simulators as well as transistor-level circuit simulation. Such systems may include a physical implementation/verification tool, e.g., IC Compiler, or ICValidator Synopsys of Mountain View, Calif., Cadence System Development Suite (e.g.: SoC Encounter, Cadence Physical Verification System) by Cadence Design Systems, Inc. of San Jose, Calif., and-"CALIBREO INROUTE" by Mentor Graphics of Wilsonville, Oreg.

The persistent, computer readable storage medium 412 is encoded with an integrated circuit (IC) cell library 400. The cell library 400 includes a plurality of cells including, but not limited to the cells 402, 404, 406, 408, 410 shown. Many other types of cells are known to those of ordinary skill in the art and are not described herein for brevity. Each cell includes data that configure an electronic design automation tool 422 to generate a layout of an IC component.

The cell library may include one or more standard cells for each of MOSFETs 402 and BTJs 406. In some embodiments, a cell 410 is provided for forming a decoupling capacitor using fringe capacitance of a pair of dummy conductors 130, 131 in the same poly layer as each other, over an STI region 105.

In some embodiments, one or more cells are provided for defining a transistor having at least one decoupling capacitor adjacent to it. In some embodiments, the cell defines a semiconductor substrate 103 having: at least one active region, having at least one active device 115, 215 that includes a polysilicon layer 120, 220, and a shallow trench isolation (STI) region 105 adjacent the active region, and a decoupling capacitor 135. If the cell is a MOSFET, the polysilicon layer is the gate electrode layer. If the cell is a BJT, the polysilicon layer is the emitter layer. The decoupling capacitor comprises first and second dummy conductive patterns 130, 131 formed in the same polysilicon layer 120 over the STI region 105. The first and second dummy conductive regions 130, 131 are unconnected to any of the at least one active device. The first dummy conductive pattern 130 is connected to a source of a first potential, and the second dummy conductive pattern connected to a source of a second potential. A dielectric material between the first and second dummy conductive patterns. The first dummy conductive pattern 130 is connected to a power bus in a conductive line layer by way of a first contact via, and the second dummy conductive pattern 131 is connected to a ground bus in the conductive line layer by way of a second contact via. The first and second dummy conductive patterns 130, 131 are sized so that a polysilicon density of the IC is greater than or equal to a target polysilicon density.

Figure 5:
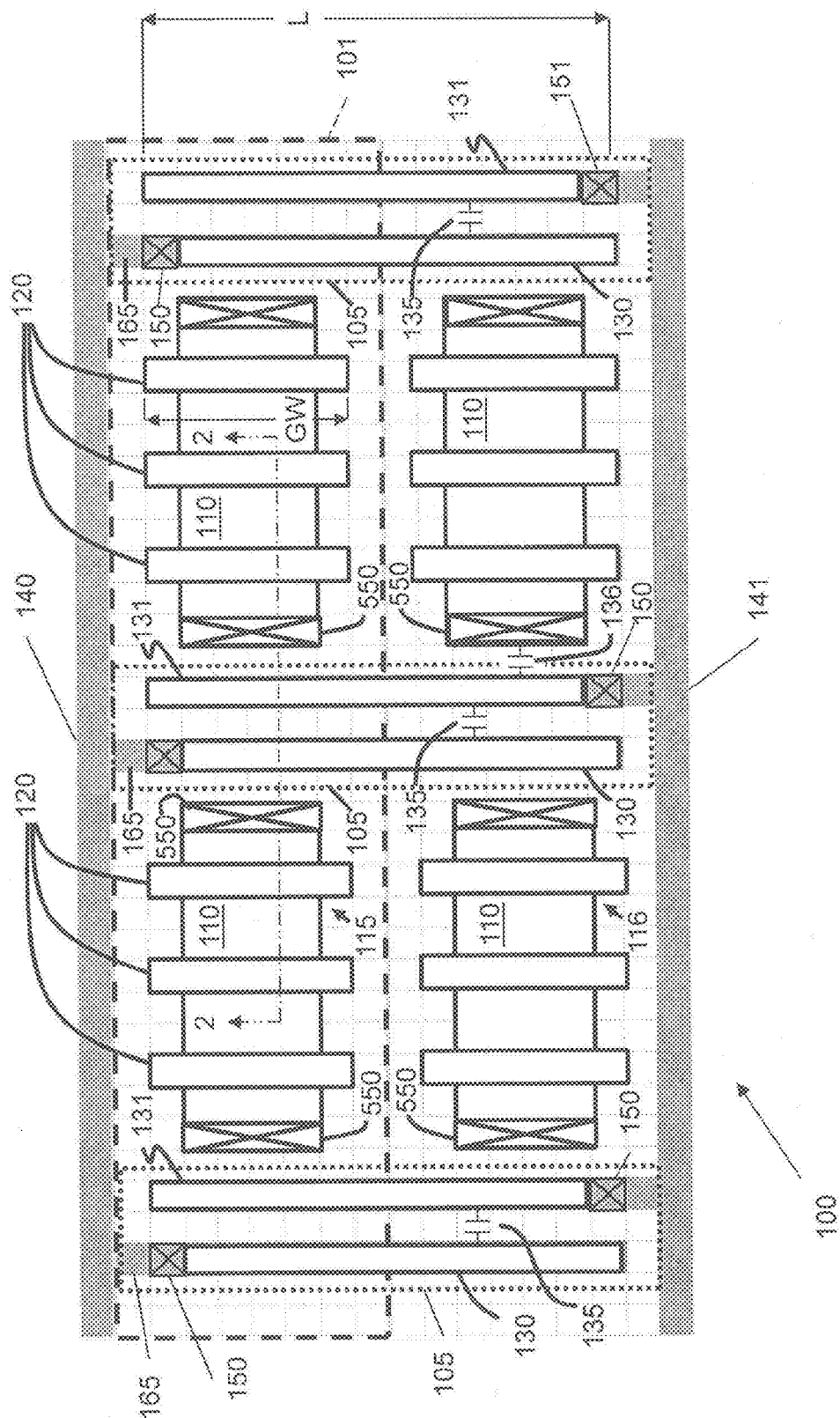
FIG. 5 is a schematic plan view of a portion of an IC having additional decoupling capacitance between metal oxide semiconductor field effect transistors (MOSFETs).

FIG. 5 shows a MOSFET embodiment similar to the embodiment of FIG. 1, with optional additional decoupling capacitance. Instead of using square or round contacts 150 for the source/drain regions 110, elongated slot contacts 550 are provided on the source/drain implant regions. The elongated slot contacts 550 provide an additional decoupling capacitance between the source/drain slot contact and the adjacent dummy conductor.

Examples are described above in which decoupling capacitances are added between adjacent transistors. In other embodiments, the decoupling capacitors may be located between other types of devices, such as, but not limited to, active area resistors and diodes.

The decoupling capacitors described herein may be used in combination with a variety of functional circuit elements, including digital and/or analog circuits.

By providing decoupling capacitors using dummy conductors that are already to be included in the layout, the structure and method described herein can save substantial area in the IC, which may be used to add other functions or redundant cells. For some designs, the area savings may be about 4.5%.

In some embodiments, a structure comprises a semiconductor substrate having at least two active regions, each having at least one active device that includes a gate electrode layer, and a shallow trench isolation (STI) region between the active regions. A decoupling capacitor comprises first and second dummy conductive patterns formed in the same gate electrode layer over the STI region. The first and second dummy conductive regions are unconnected to any of the at least one active device. The first dummy conductive pattern is connected to a source of a first potential. The second dummy conductive pattern is connected to a source of a second potential. A dielectric material is provided between the first and second dummy conductive patterns.

In some embodiments, a structure comprises a semiconductor substrate having at least two active regions, and a shallow trench isolation (STI) region between the active regions. Each active region has at least one active device that includes a polysilicon layer. A decoupling capacitor comprises first and second dummy conductive patterns formed in the same polysilicon layer over the STI region. The first and second dummy conductive regions are unconnected to any of the at least one active device. The first dummy conductive pattern is connected to a source of a first potential. The second dummy conductive pattern is connected to a source of a second potential. A dielectric material is provided between the first and second dummy conductive patterns.

In some embodiments, a method comprises: (a) providing a semiconductor substrate having at least two active regions, and a shallow trench isolation (STI) region between the active regions; (b) forming a single gate electrode layer above the substrate, the gate electrode layer having: at least one gate electrode above each of the at least two active regions, and first and second dummy conductive patterns above the STI region, the first and second dummy conductive regions being unconnected to any of the at least one active device, the first dummy conductive pattern to be connected to a source of a first potential, the second dummy conductive pattern to be connected to a source of a second potential; and (c) providing a dielectric material between the first and second dummy conductive patterns, thereby to form a decoupling capacitor.

Although the subject matter has been described in terms of exemplary embodiments, it is not limited thereto. Rather, the appended claims should be construed broadly, to include other variants and embodiments, which may be made by those skilled in the art.

What is claimed is:

1. A structure comprising: a semiconductor substrate having: at least two active regions, each having at least one active device that includes a gate electrode layer, and a shallow trench isolation (STI) region between the active regions; and a capacitor comprising: first and second dummy conductive patterns formed in the gate electrode layer directly over the STI region; and a dielectric material between the first and second dummy conductive patterns.

2. The structure of claim 1, wherein the first and second dummy conductive regions are unconnected to any of the at least two active devices.

3. The structure of claim 1, wherein the capacitor is a decoupling capacitor.

4. The structure of claim 1, wherein the substrate comprises a first active region containing a first active device, a second active region containing a second device, and a third active region between the first active region and a ground bus.

5. The structure of claim 4, wherein each of the first and second conductive patterns extends nearly a distance between a power bus and the ground bus.

6. The structure of claim 1, wherein the first dummy conductive pattern is connected to power, and the second dummy conductive pattern is connected to a ground.

7. The structure of claim 1, wherein each active region includes at least one bipolar junction transistor (BJT), and the first and second dummy conductive patterns are line segments, each having a length that is greater than a length of an emitter of each BJT.

8. The structure of claim 1, wherein the first and second dummy conductive patterns are formed of polycrystalline silicon or a metal gate material.

9. The structure of claim 1, wherein the first and second dummy conductive patterns are parallel to each other.

10. A structure comprising: a semiconductor substrate having:
at least two bipolar junction transistors (BJT) that include a polysilicon layer in which an emitter is formed, and a shallow trench isolation (STI) region between the at least two BJT, and first and second conductive patterns formed in the polysilicon layer directly over the STI region, the first conductive pattern configured to be connected to a source of a first potential, the second conductive pattern configured to be connected to a source of a second potential.

11. The structure of claim 10, further comprising a dielectric material between the first and second conductive patterns.

12. The structure of claim 10, wherein the first and second conductive patterns are dummy patterns.

13. The structure of claim 10, wherein the first and second conductive regions are included in a decoupling capacitor.

14. The structure of claim 10, wherein the polysilicon layer is doped in the emitter region.

15. The structure of claim 10, wherein the first and second conductive patterns are parallel to each other.

16. A structure comprising: a semiconductor substrate having:
at least two bipolar junction transistors (BJT), each including an emitter layer, and a shallow trench isolation (STI) region between the BJTs; and first and second dummy conductive patterns formed in the emitter layer and directly over the STI region.

17. The structure of claim 16, further comprising a dielectric material between the first and second dummy conductive patterns.

18. The structure of claim 16, wherein the first and second dummy conductive patterns are parallel to each other.

19. The structure of claim 16, wherein the capacitor is a decoupling capacitor.

20. The structure of claim 16, wherein the first and second dummy conductive patterns are formed of polycrystalline silicon.

* * * * *